(12) United States Patent
Tu et al.

(10) Patent No.: US 10,854,553 B1
(45) Date of Patent: Dec. 1, 2020

(54) SEMICONDUCTOR PACKAGE STRUCTURE AND A METHOD OF MANUFACTURING THE SAME

(71) Applicant: Advanced Semiconductor Engineering, Inc., Kaohsiung (TW)

(72) Inventors: Shun-Tsat Tu, Kaohsiung (TW); Chunku Kuo, Kaohsiung (TW); Ya-Tian Hou, Kaohsiung (TW); Tsung-Chieh Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/424,228

(22) Filed: May 28, 2019

(51) Int. Cl.
```
H01L 23/538    (2006.01)
H01L 23/00     (2006.01)
H01L 23/31     (2006.01)
H01L 21/48     (2006.01)
H01L 21/56     (2006.01)
```
(52) U.S. Cl.
CPC ........ *H01L 23/5389* (2013.01); *H01L 21/486* (2013.01); *H01L 21/4853* (2013.01); *H01L 21/565* (2013.01); *H01L 23/3128* (2013.01); *H01L 23/5384* (2013.01); *H01L 23/5386* (2013.01); *H01L 24/08* (2013.01); *H01L 24/16* (2013.01); *H01L 24/48* (2013.01); *H01L 24/80* (2013.01); *H01L 2224/08225* (2013.01); *H01L 2224/16227* (2013.01); *H01L 2224/48227* (2013.01); *H01L 2224/80031* (2013.01); *H01L 2224/80895* (2013.01); *H01L 2224/80896* (2013.01)

(58) Field of Classification Search
CPC . H01L 21/4853; H01L 21/486; H01L 21/565; H01L 23/3128; H01L 23/5384; H01L 23/5386; H01L 23/5389; H01L 24/08; H01L 24/16; H01L 24/48; H01L 24/80
See application file for complete search history.

(56) References Cited

U.S. PATENT DOCUMENTS 9,412,662 B2 * 8/2016 Lin ................. H01L 21/561
2015/0214110 A1 7/2015 Lin et al.

* cited by examiner

*Primary Examiner* — Andrew Q Tran
(74) *Attorney, Agent, or Firm* — Foley & Lardner LLP (57) ABSTRACT

A semiconductor package structure includes a substrate having a patterned surface, the patterned surface including a first region and a second region, wherein a first line width in the first region is smaller than a second line width in the second region. The semiconductor package structure further includes a first die hybrid-bonded to the first region through conductive features adapted for the first line width, and a second die bonded to the second region through conductive features adapted for the second line width. The manufacturing operations of the semiconductor package structure are also disclosed.

20 Claims, 13 Drawing Sheets

SEMICONDUCTOR PACKAGE STRUCTURE AND A METHOD OF MANUFACTURING THE SAME

BACKGROUND

1. Technical Field

The present disclosure relates to a semiconductor package structure having a system in package structure with at least one hybrid bonded die.

2. Description of the Related Art

Along with the number of I/O per die increases, hybrid-bonding is developed to adapt for the shrinkage of bonding line width. However, the cost of hybrid-bonding is high and the constraint of hybrid-bonding stringent.

Hybrid-bonding is a bonding operation involving two hybrid surfaces, each including a heterogeneous surface, for example, a surface including a conductive feature and a dielectric feature. Hybrid-bonding first undergoes a dielectric-dielectric connection, followed by conductive feature connection. Prior to the two surface bonding, the dielectric feature and the conductive feature on each surface are prepared by a planarization operation, for example, a chemical mechanical polishing (CMP) operation.

System-in-package (SIP) is a technology which may allow integrated single packaging of different kinds of electronic devices. SIP may provide increases in the performance and function of semiconductor devices while decreasing their size and/or cost. Normally when various electronic devices or dies are to be boned to a substrate or platform of the SIP, the various electronic devices may be subject to a single bonding operation, for example, a hybrid-bonding operation.

SUMMARY

In some embodiments, according to one aspect, a semiconductor package structure with a substrate having a patterned surface, the patterned surface including a first region and a second region, wherein a first line width in the first region is smaller than a second line width in the second region. The semiconductor package structure further has a first die hybrid-bonded to the first region through conductive features adapted for the first line width, and a second die bonded to the second region through conductive features adapted for the second line width.

In some embodiments, according to one aspect, a system-in-package (SIP) structure including a substrate having a patterned surface, the patterned surface having a first conductive pattern and a second conductive pattern. The SIP structure further includes a first die hybrid-bonded to the first conductive pattern of the patterned surface through conductive features adapted for the first conductive pattern, and a second die bonded to the second conductive pattern of the patterned surface through conductive features adapted for the second conductive pattern.

In some embodiments, according to another aspect, a method is disclosed for manufacturing a semiconductor package structure. The method includes: providing a substrate having a patterned surface, the patterned surface includes a first conductive pattern and a second conductive pattern; performing a planarization operation on the patterned surface, the first conductive pattern having a first dishing response to a planarization operation, and the second conductive pattern having a second dishing response to the planarization operation, the first dishing response being different from the second dishing response; hybrid-bonding a first die to the first region through conductive features adapted for the first conductive pattern; and bonding a second die to the first region through conductive features adapted for the second conductive pattern.

BRIEF DESCRIPTION OF THE DRAWINGS

FIG. 1A' illustrates a top view of a semiconductor package structure of FIG. 1A.

FIG. 6A, FIG. 6B, FIG. 6C, FIG. 6D, FIG. 6E, FIG. 6F, FIG. 6G, FIG. 6H, FIG. 6G', FIG. 6H'.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Due to the fact that the CMP slurry possesses a certain degree of selectivity, the planarized surface of the conductive feature and the planarized surface of the dielectric feature may not be leveled, or coplanar. For instance, CMP slurry may cause the dishing of conductive feature as well as the erosion of dielectric feature. The extent of dishing is varied according to different dimension, or line width, of the conductive feature. In a system-in-package (SIP), various electronic devices may possess different I/O counts and thus different dimensions or line widths, of conductive features, thereby having non-uniform dishing or erosion scenario across the substrate or carrier in the SIP.

The constraint of hybrid-bonding is stringent, for example, dishing of the conductive feature, after a planarization operation, has to be controlled under 5 nm, and the erosion of the dielectric surface, after the planarization operation, has to be controlled within 2 nm, in order to facilitate the process of hybrid-bonding. In a SIP structure, electronic devices possess different I/O counts and thus different dimensions or line widths of conductive features. If those conductive features on the substrate of carrier of the SIP are fabricated under a single planarization operation, the dishing or erosion in different line width regions may behave differently. Conductive features in some line width regions may be suitable for subsequent hybrid bonding process whereas conductive features in other line width regions may not be suitable for subsequent hybrid bonding process. However, in some comparative embodiments, in order to streamline and simplify the manufacturing operations, hybrid boning operation is implemented on all regions of the substrate, including the regions with greater line width, e.g., greater than 20 nm, and regions with smaller line width, e.g., smaller than 20 nm. The result showing that implementing hybrid bonding operations in regions with line width greater than 20 nm lead to unsatisfactory bonding result affecting packaged product yield.

Present disclosure provides a SIP structure and method of manufacturing said SIP structure. The SIP structure includes a substrate, a first die hybrid-bonded to the substrate, and a second die bonded to the substrate using bonding style other than hybrid bonding, for example, flip-chip bonding or wire bonding.

Figure 1A:
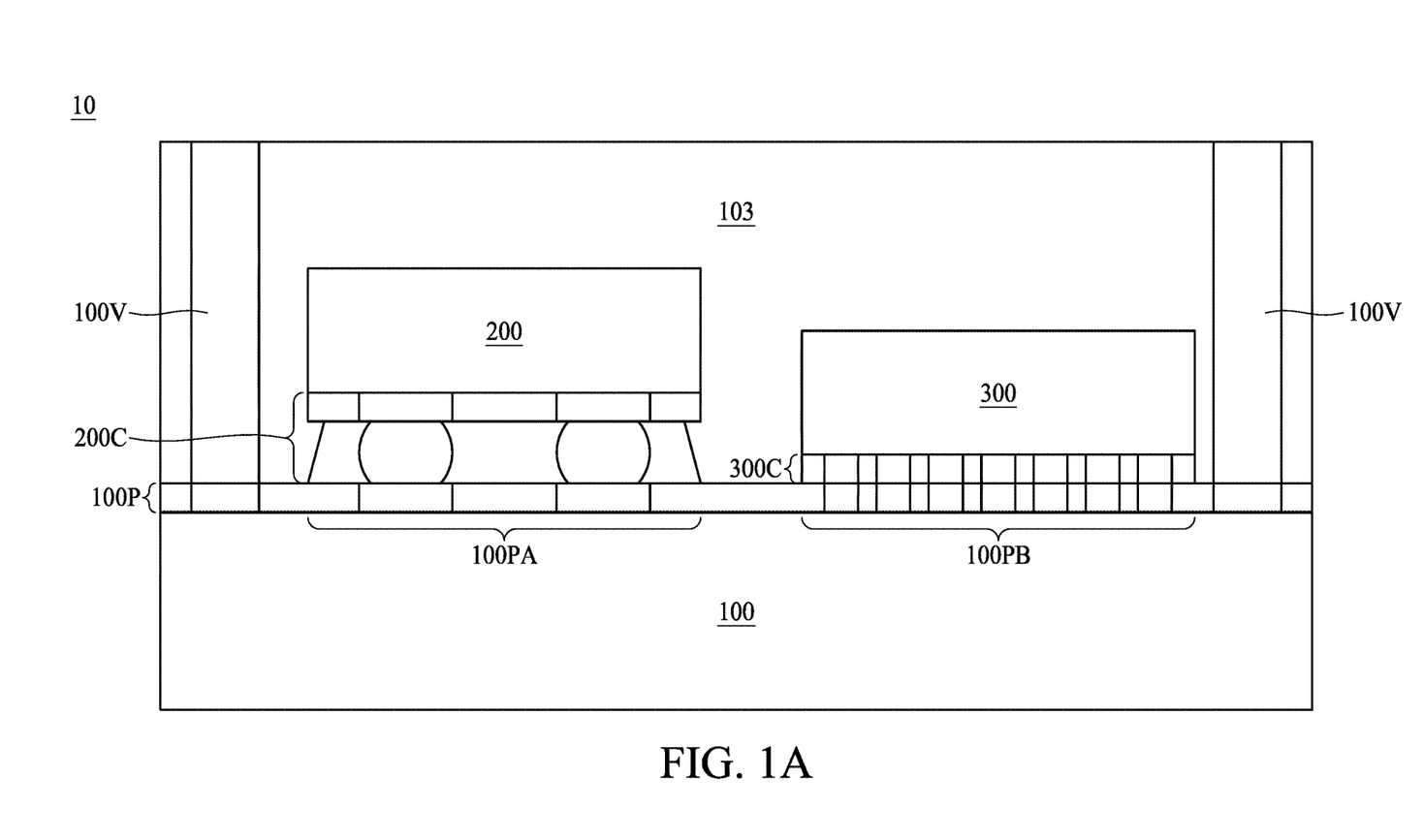
FIG. 1A illustrates a cross-sectional view of a semiconductor package structure according to some embodiments of the present disclosure.

FIG. 1A illustrates a cross-sectional view of a semiconductor package structure 10 according to some embodiments of the present disclosure. The semiconductor package structure 10 includes a substrate 100. The substrate can be a carrier, a semiconductor die, or an interposer. In some embodiments, the substrate 100 includes a patterned surface 100P in conjunction with a first die 300 and a second die 200. The patterned surface 100P may include a plurality of regions having the same or different line width features. For example, the patterned surface 100P may have a first region 100PB and a second region 100PA. The first region 100PB may or may not be adjacent to the second region 100PA. In some embodiments, the first region 100PB has a line width L1 (labeled in FIG. 1A') that may be different from a line width L2 (labeled in FIG. 1A') of the second region 100PA. The patterned surface 100P includes a substantial planar construction encompassing the first region 100PB and the second region 100PA.

Referring to FIG. 1A', FIG. 1A' illustrates a top view of a semiconductor package structure of FIG. 1A. FIG. 1A' shows the first region 100PB and the second region 100PA as illustrated in FIG. 1A. The first region 100PB of the patterned surface may include a plurality of conductive patterns corresponding or partly corresponding to the semiconductor element, for example, a first semiconductor die, subsequently bonded from above. The second region 100PA of the patterned surface may include a plurality of conductive patterns corresponding or partly corresponding to the semiconductor element, for example, a second semiconductor die, subsequently bonded from above. As shown from a top view perspective, a line width L1 of the conducive pattern in the first region 100PB is smaller than a line width L2 of the conducive pattern in the second region 100PA. In some embodiments, line width L1 of the conducive pattern in the first region 100PB is suitable for hybrid bonding operation. In some embodiments, a maximum line width L1 of the conducive pattern in the first region 100PB is less than 20 nm. In some embodiments, an average line width L1 of the conducive pattern in the first region 100PB is less than 20 nm. In some embodiments, line width L2 of the conducive pattern in the second region 100PA is suitable for bonding operation other than hybrid bonding, for example, flip chip bonding or wire bonding. In some embodiments, a minimum line width L2 of the conductive pattern in the second region 100PA is greater than 20 nm. In some embodiments, an average line width L2 of the conducive pattern in the second region 100PA is greater than 20 nm. In some embodiments, a minimum pitch P1 of the conductive pattern in the first region 100PB is smaller than a minimum pitch P2 of the conductive pattern in the second region 100PA.

Referring back to FIG. 1A, the semiconductor package structure further includes a die 300 bonded to the first region 100PB of the patterned surface 100P and a die 200 bonded to the second region 100PA of the patterned surface 100P. In some embodiments, the die 300 is hybrid-bonded to the first region 100PB, whereas the die 200 can be flip-chip bonded to the second region 100PA.

Die 300 may include an active surface facing the substrate 100, and the active surface possessing conductive features 300C adapted for the conductive pattern in the first region 100PB. In some embodiments, the conductive features 300C include copper pillars or copper bumps surrounded by a dielectric layer. A substantially coplanar surface can be observed at a top surface of the copper pillars or copper bumps and a top surface of the dielectric layer. In some embodiments, the conductive features 300C is prepared for hybrid-bonding with the conductive pattern in the first region 100PB. In some embodiments, the conductive features 300C is having identical conductive patterns with that in the first region 100PB. For example, line width of the conducive pattern on the active surface of the die 300 is suitable for hybrid bonding operation. In some embodiments, a maximum line width of the conducive pattern on the active surface of the die 300 is less than 20 nm. In some embodiments, an average line width of the conducive pattern on the active surface of the die 300 is less than 20 nm.

Die 200 may include an active surface facing the substrate 100, and the active surface possessing conductive features 200C adapted for the conductive pattern in the second region 100PA. In some embodiments, the conductive features 200C include copper pads surrounded by a dielectric layer and solder bumps surrounded by an underfill structure. In some embodiments, the conductive features 200C is prepared for flip-chip bonding with the conductive pattern in the second region 100PA. In some embodiments, the conductive features 200C is having identical conductive patterns with that in the second region 100PA. In some embodiments, line width of the conducive pattern on the active surface of the die 200 is suitable for bonding operation other than hybrid bonding, for example, flip chip bonding or wire bonding. In some embodiments, a minimum line width of the conducive pattern on the active surface of the die 300 is greater than 20 nm. In some embodiments, an average line width of the conducive pattern on the active surface of the die 300 is greater than 20 nm. In some embodiments, a minimum pitch of the conductive pattern on the active surface of the die 200 is smaller than a minimum pitch of the conductive pattern on the active surface of the die 300.

The semiconductor package structure 10 further includes a through via 100V on the patterned surface 100P and disposed at the same level as the die 300. The through via 100V is electrically connected to die 200 and/or die 300 through the conductive patterns on the patterned surface 100P. In some embodiments, the through via 100V is surrounded by encapsulant 103 encapsulating die 200 and die 300 over the substrate 100. In some embodiments, the through via 100V can be a copper pillar with a principle dimension extending perpendicular to the patterned surface 100P of the substrate 100. A height of the through via 100V may be greater than a height of the die 200 or the die 300.

Figure 1B:
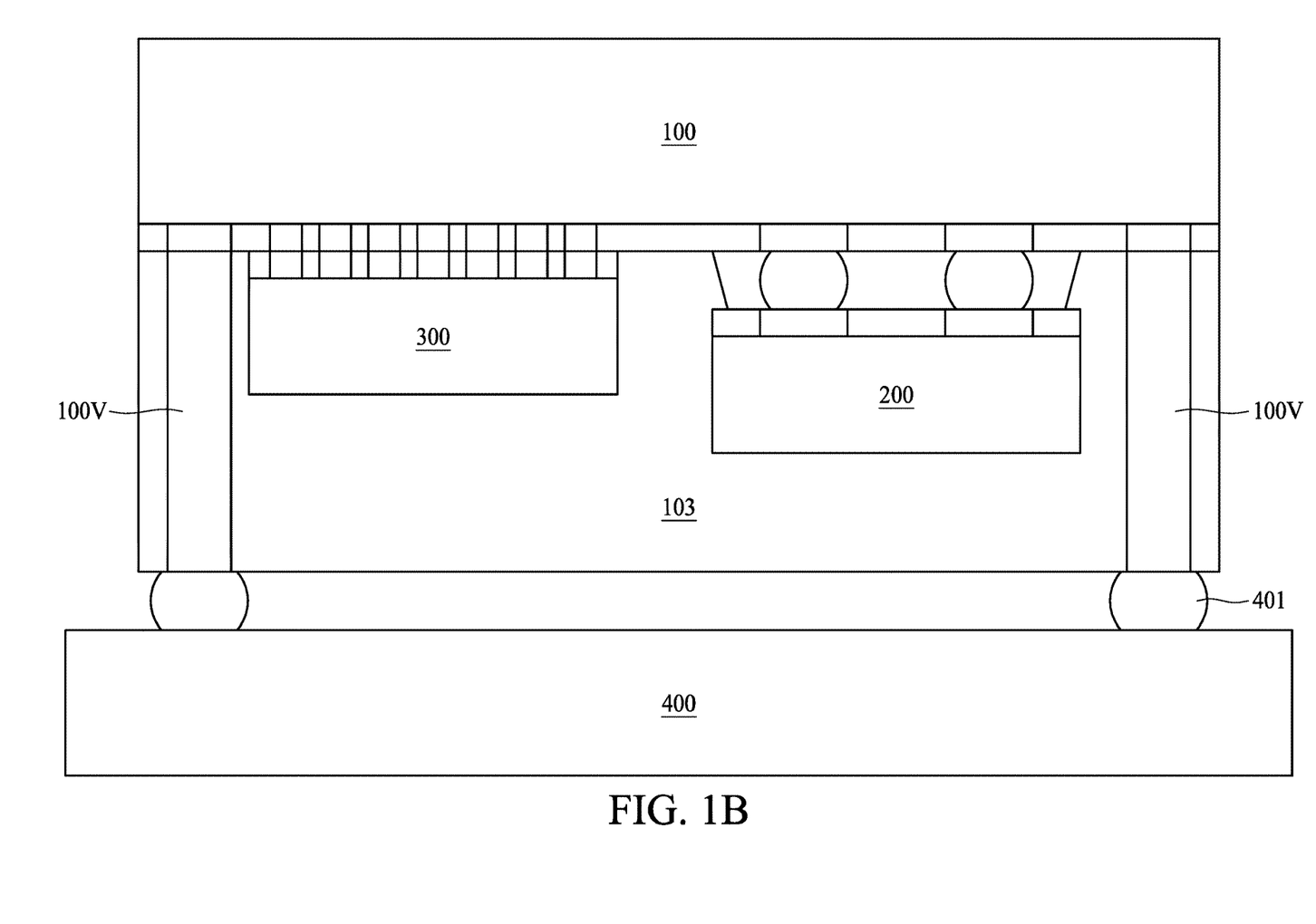
FIG. 1B illustrates a cross-sectional view of a semiconductor package structure according to some embodiments of the present disclosure.

FIG. 1B illustrates a cross-sectional view of a semiconductor package structure according to some embodiments of the present disclosure. FIG. 1B shows the semiconductor package structure 10 of FIG. 1A bonded to a carrier 400 through conductive terminals 401 and the through via 100V. As shown in FIG. 1B, the semiconductor package structure 10 is flipped upside-down to be in contact with the carrier 400, for example, a printable circuit board (PCB), thorough a connection of the conductive terminals 401, for example, a solder bump. In some embodiments, the semiconductor package structure of FIG. 1B is a system-in-package structure (SIP) where the substrate 100 is a die electrically coupling to die 300 hybrid-bonded thereto and die 200 flip-chip bonded thereto.

Figure 2:
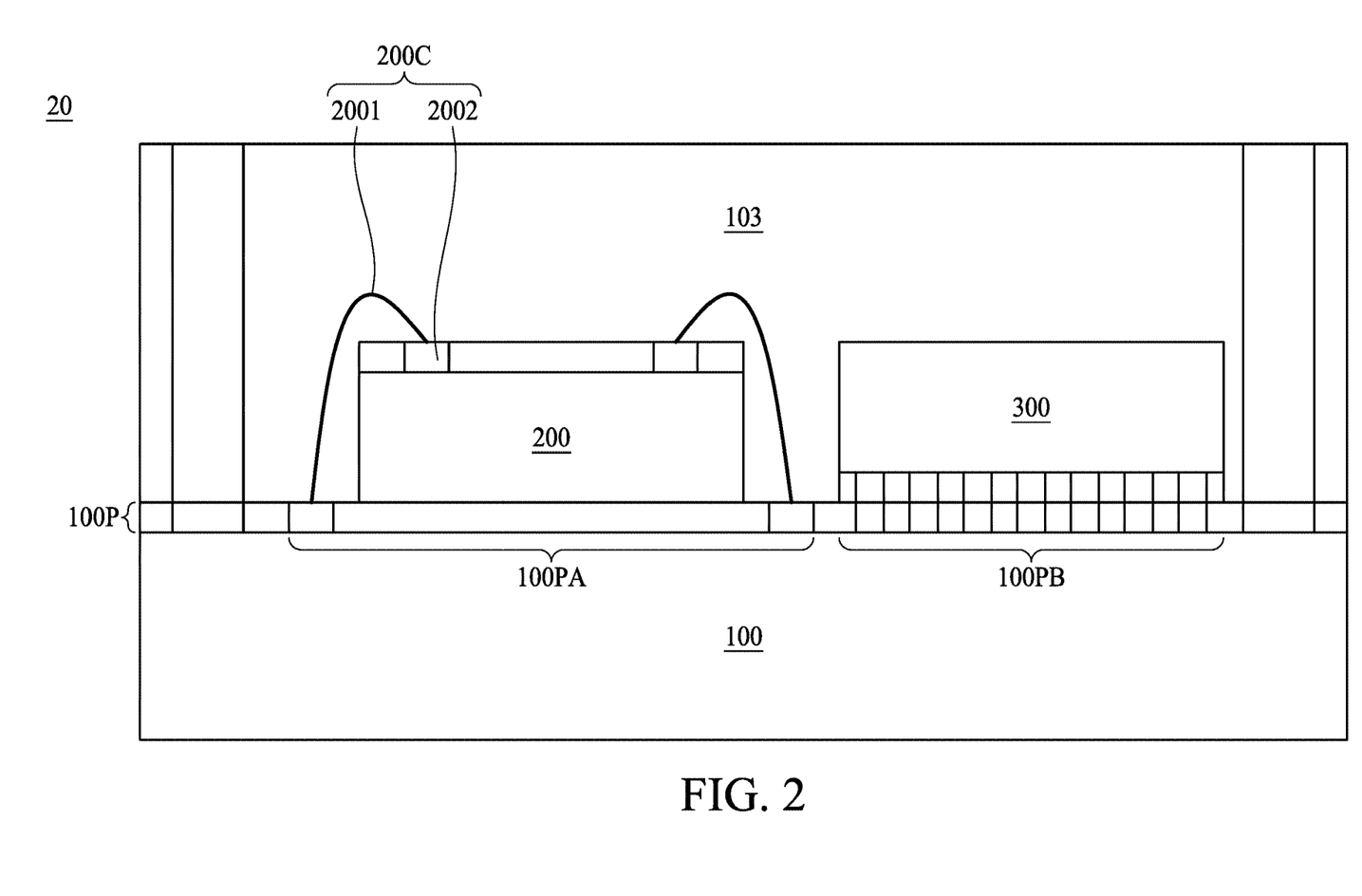
FIG. 2 illustrates a cross-sectional view of a semiconductor package structure according to some embodiments of the present disclosure.

FIG. 2 illustrates a cross-sectional view of a semiconductor package structure 20 according to some embodiments of the present disclosure. The semiconductor package structure 20 is similar to the semiconductor package structure 10 except for the bonding type of the die 200 to the substrate 100. As shown in FIG. 2, the die 200 is bonded to the second region 100PA of the patterned surface 100P through a non-hybrid bonding operation, for example, through a wire bonding operation. The patterned surface 100P may be prepared according to a standard of hybrid-bonding operation, however, due to the different dishing and erosion responses to regions of different line widths, the dies subsequently bonded to the patterned surface 100P may not be conducted solely through hybrid bonding. Die 200 may include an active surface facing away from the substrate 100, and the active surface possessing conductive features 300C adapted for the conductive pattern in the second region 100PA. In some embodiments, the conductive features 200C include copper pads 2002 surrounded by a dielectric layer and a conductive wire 2001. The conductive wire 2001 is configured to electrically couple the active surface of the die 200 and the conductive pattern in the second region 100PA of the patterned surface 100P. In some embodiments, the conductive features 200C is prepared for wire bonding with the conductive pattern in the second region 100PA. In some embodiments, the conductive features 200C is having different conductive patterns with that in the second region 100PA.

Similar to the semiconductor package structure 10 of FIG. 1A, a minimum line width of the conducive pattern on the active surface of the die 200 is greater than 20 nm as shown in FIG. 2. In some embodiments, an average line width of the conducive pattern on the active surface of the die 200 is greater than 20 nm. In some embodiments, a minimum pitch of the conductive pattern on the active surface of the die 200 is smaller than a minimum pitch of the conductive pattern on the active surface of the die 200.

Figure 3A:
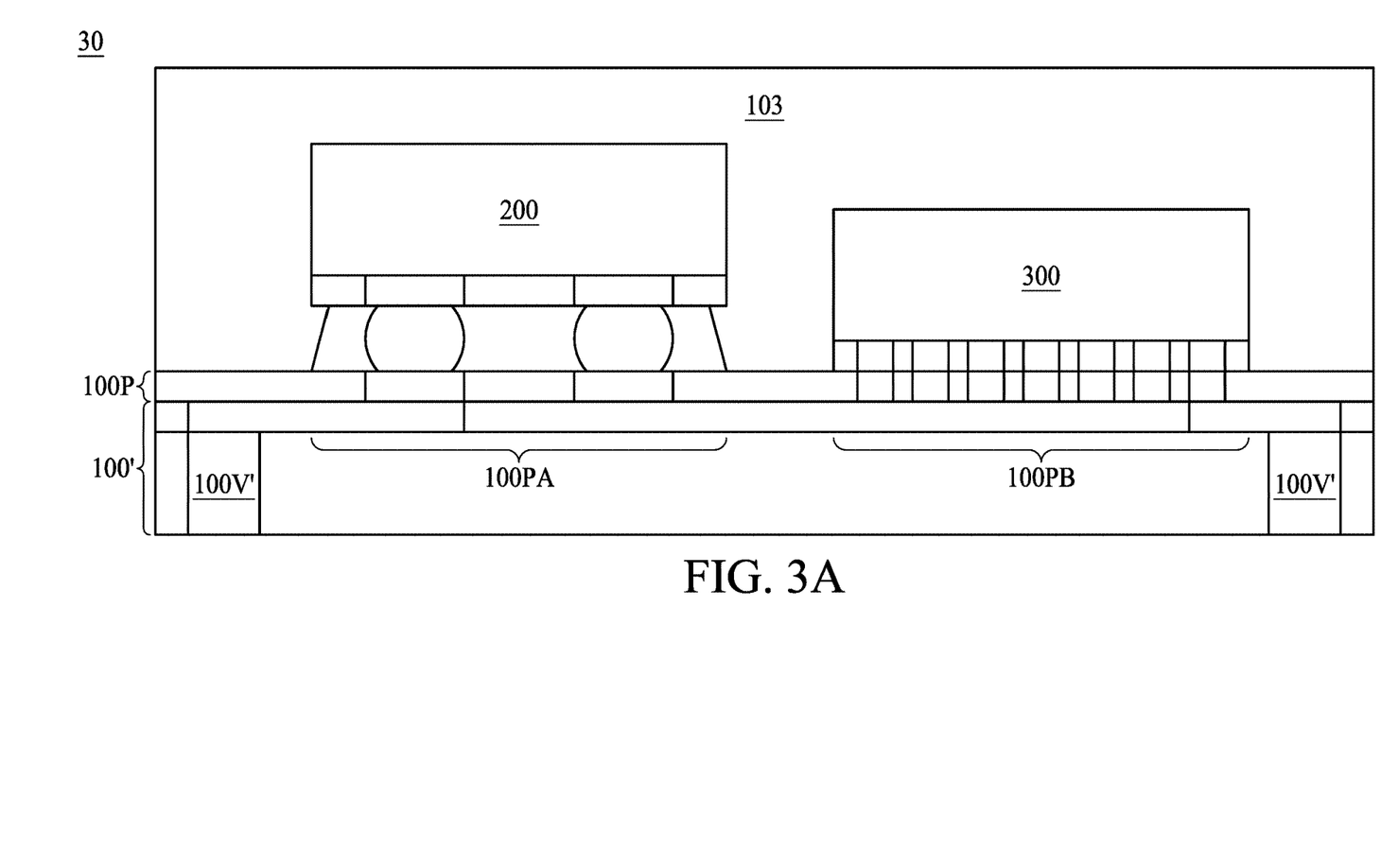
FIG. 3A illustrates a cross-sectional view of a semiconductor package structure according to some embodiments of the present disclosure.

FIG. 3A illustrates a cross-sectional view of a semiconductor package structure 30 according to some embodiments of the present disclosure. The semiconductor package structure 30 includes a substrate 100'. The substrate 100' can be an interposer. In some embodiments, the interposer includes a patterned surface 100P in conjunction with a first die 300 and a second die 200. The patterned surface 100P may include a plurality of regions having the same or different line width features. For example, the patterned surface 100P may have a first region 100PB and a second region 100PA. The first region 100PB may or may not be adjacent to the second region 100PA. In some embodiments, the first region 100PB has a line width L1 (labeled in FIG. 1A') that may be different from a line width L2 (labeled in FIG. 1A') of the second region 100PA. The patterned surface 100P includes a substantial planar construction encompassing the first region 100PB and the second region 100PA. Identical numeral labels in FIG. 3A refer to substantially identical elements or their equivalents in FIG. 1A or other embodiments in present disclosure.

The semiconductor package structure 30 further includes a through via 100V' in the substrate 100', or the interposer. The through via 100V' is electrically connected to die 200 and/or die 300 through the conductive patterns on the patterned surface 100P. In some embodiments, the through via 100V' is surrounded by substances spacing the conductive wirings in the interposer, for example, silicon or dielectrics. In some embodiments, the through via 100V' is under the patterned surface 100P. In some embodiments, the through via 100V' can be a copper pillar with a principle dimension extending perpendicular to the patterned surface 100P of the substrate 100'. In some embodiments, the through via 100V' can be a copper or aluminum metal routing through the interposer in order to form external conductive terminals allowing the semiconductor package structure 30 to electrically couple to other substrate or carriers.

Figure 3B:
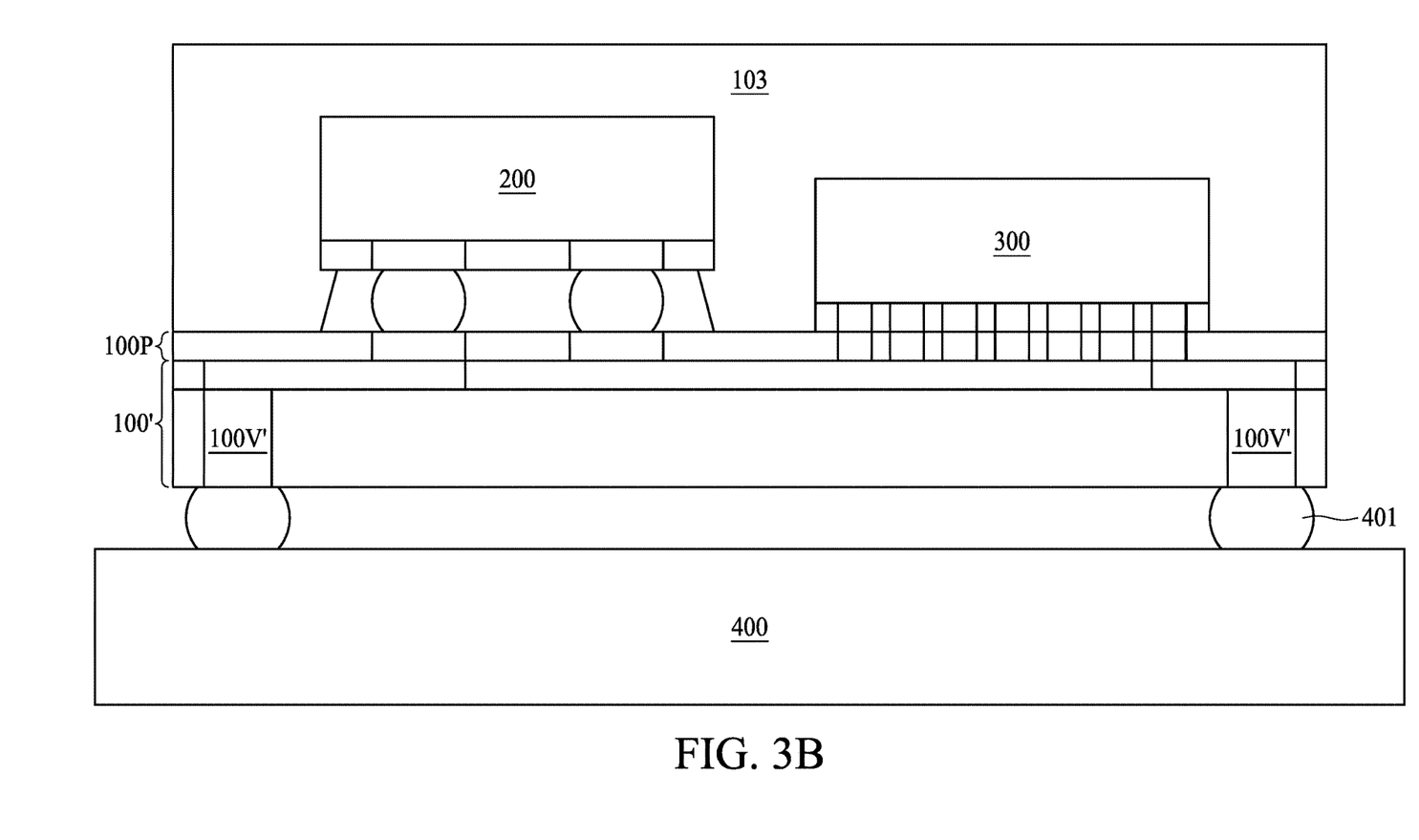
FIG. 3B illustrates a cross-sectional view of a semiconductor package structure according to some embodiments of the present disclosure.

FIG. 3B illustrates a cross-sectional view of a semiconductor package structure according to some embodiments of the present disclosure. FIG. 3B shows the semiconductor package structure 30 of FIG. 3A bonded to a carrier 400 through conductive terminals 401 and the through via 100V'. As shown in FIG. 3B, the semiconductor package structure 30 is in contact with the carrier 400, for example, a printable circuit board (PCB), thorough a connection of the conductive terminals 401, for example, a solder bump. In some embodiments, the semiconductor package structure of FIG. 3B is a system-in-package structure (SIP) where the substrate 100' is a an interposer electrically coupling die 300 and die 200 to the carrier 400, for example, a semiconductor die or a common platform such a PCB.

Figure 4:
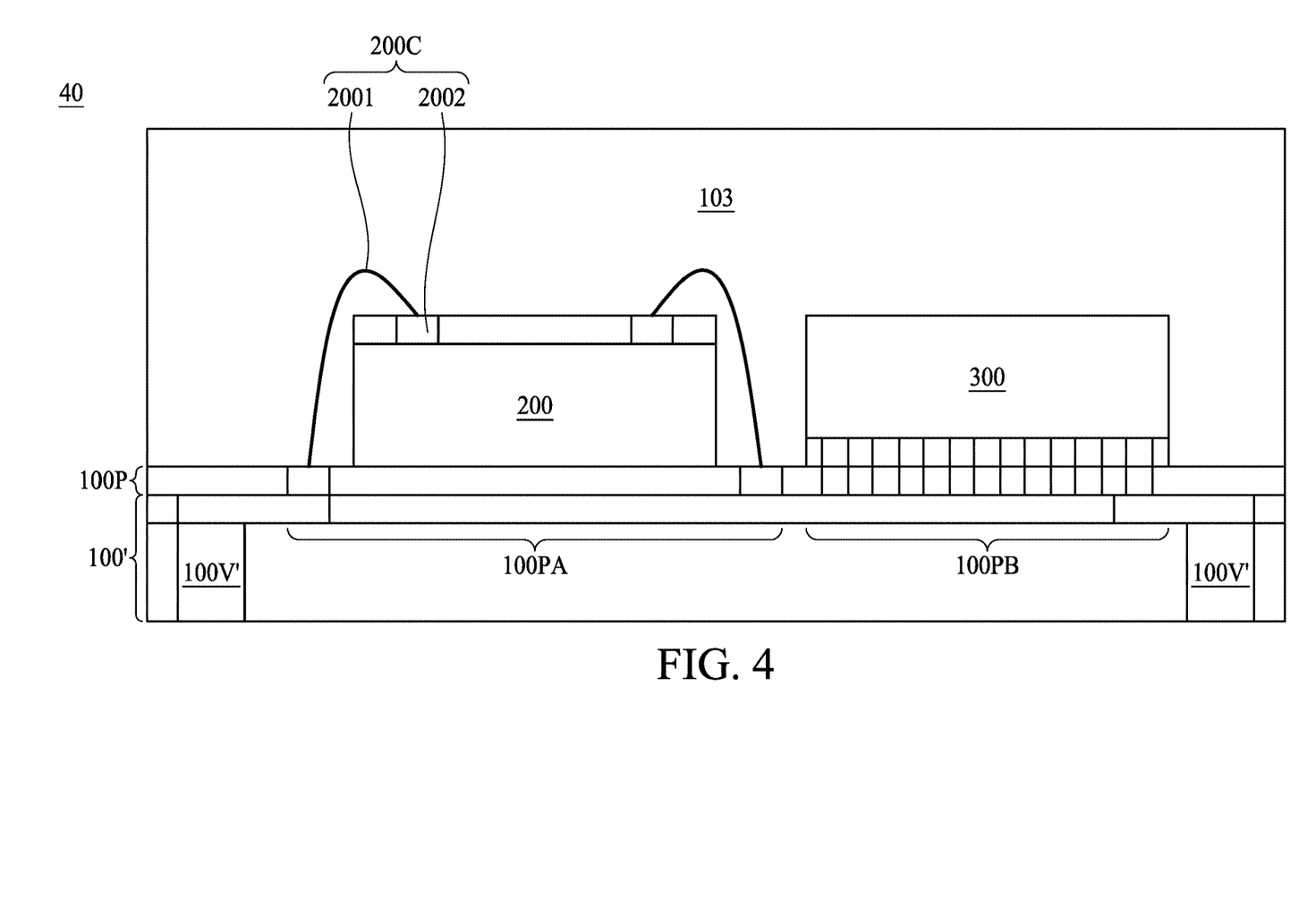
FIG. 4 illustrates a cross-sectional view of a semiconductor package structure according to some embodiments of the present disclosure.

FIG. 4 illustrates a cross-sectional view of a semiconductor package structure 40 according to some embodiments of the present disclosure. The semiconductor package structure 40 is similar to the semiconductor package structure 30 except for the bonding type of the die 200 to the substrate 100'. As shown in FIG. 4, the die 200 is bonded to the second region 100PA of the patterned surface 100P through a non-hybrid bonding operation, for example, through a wire bonding operation. The patterned surface 100P may be prepared according to a standard of hybrid-bonding operation, however, due to the different dishing and erosion responses to regions of different line widths, the dies subsequently bonded to the patterned surface 100P may not be conducted solely through hybrid bonding. Die 200 may include an active surface facing away from the substrate 100', and the active surface possessing conductive features 200C adapted for the conductive pattern in the second region 100PA. In some embodiments, the conductive features 200C include copper pads 2002 surrounded by a dielectric layer and a conductive wire 2001. The conductive wire 2001 is configured to electrically couple the active surface of the die 200 and the conductive pattern in the second region 100PA of the patterned surface 100P. In some embodiments, the conductive features 200C is prepared for wire bonding with the conductive pattern in the second region 100PA. In some embodiments, the conductive features 200C is having different conductive patterns with that in the second region 100PA.

Similar to the semiconductor package structure 30 of FIG. 3A, a minimum line width of the conducive pattern on the active surface of the die 200 is greater than 20 nm as shown in FIG. 2. In some embodiments, an average line width of the conducive pattern on the active surface of the die 200 is greater than 20 nm. In some embodiments, a minimum pitch of the conductive pattern on the active surface of the die 200 is smaller than a minimum pitch of the conductive pattern on the active surface of the die 200.

Figure 5:
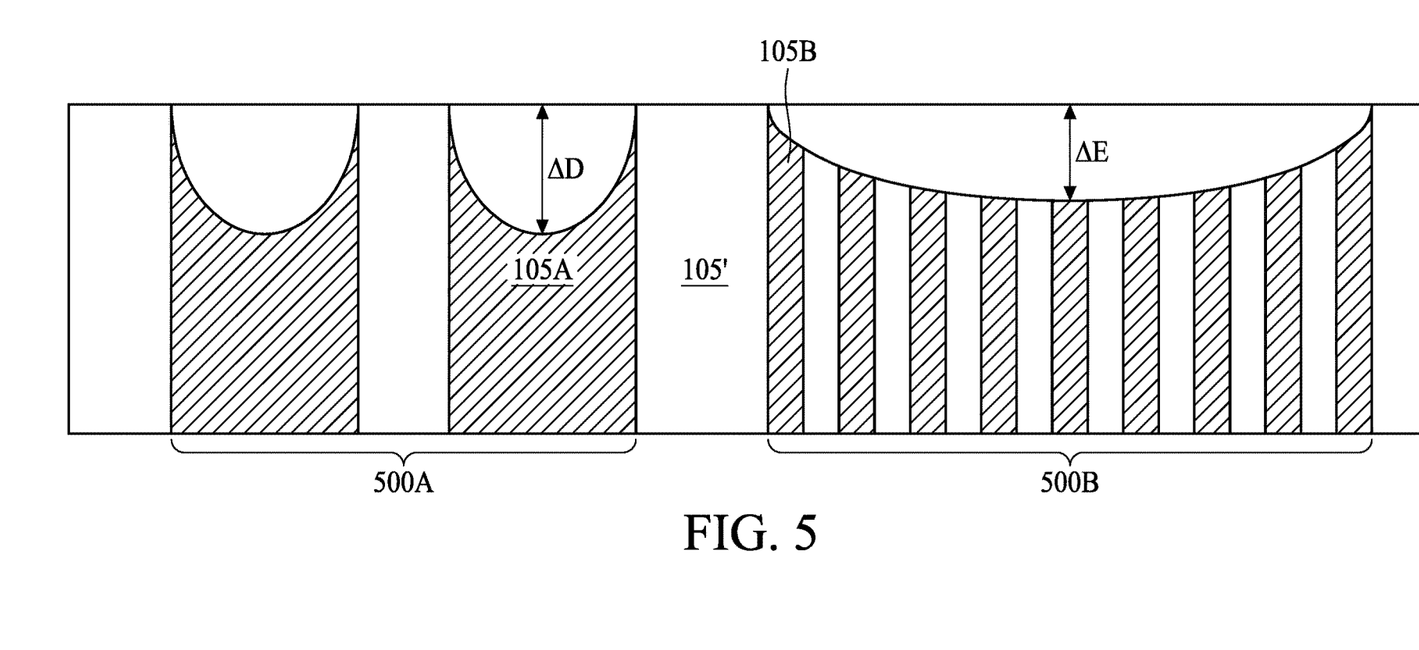
FIG. 5 illustrates a cross-sectional view of a dishing of a patterned region with greater line width and an erosion of a patterned region with smaller line width, according to some embodiment of the present disclosure.

FIG. 5 illustrates a cross-sectional view of a dishing of a patterned region 500A with greater line width and an erosion of a patterned region 500B with smaller line width, according to some embodiment of the present disclosure. In FIG. 5, patterned region 500A and 500B having identical metal density. After conducting a planarization operation including chemical agents on the surface including the patterned region 500A and patterned region 500B, a dishing ΔD in the metal portion 105A of the patterned region 500A is more prominent than dielectric erosion, whereas the dielectric erosion ΔE in the overall of the patterned region 500B is more prominent than metal dishing. Hybrid-bonding first undergoes a dielectric-dielectric connection, followed by conductive feature connection. Prior to the two surface bonding, the dielectric feature and the conductive feature on each surface are prepared by a planarization operation, for example, a chemical mechanical polishing (CMP) operation. Dielectric-dielectric connection specifies two flat dielectric surfaces to be bonded, and followed by an annealing operation which expand the volume of the metal potion, e.g., 105A and 105B in the patterned regions 500A, 500B, respectively. Elevated temperature allows the interdiffusion of the aforesaid metal portions and complete the metal-metal connection of the hybrid bonding operation.

As demonstrated in FIG. 5, in some embodiments, the extent of dishing ΔD and the extent of erosion ΔE may be different in region with different line width across the bonding surface, selection of different bonding types on a same planarized surface may be implemented. Although against the concept of streamlining and simplifying manufacturing operations, adopting different bonding types on a planarized, or hybrid-bonding ready, surface according to the line widths is proposed in the present disclosure.

Figure 6A:
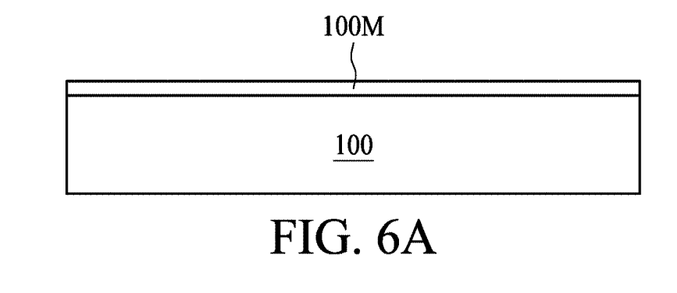
Figure 6B:
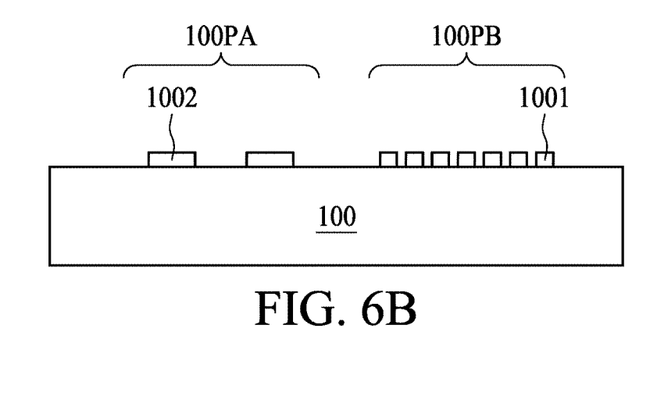
Figure 6C:
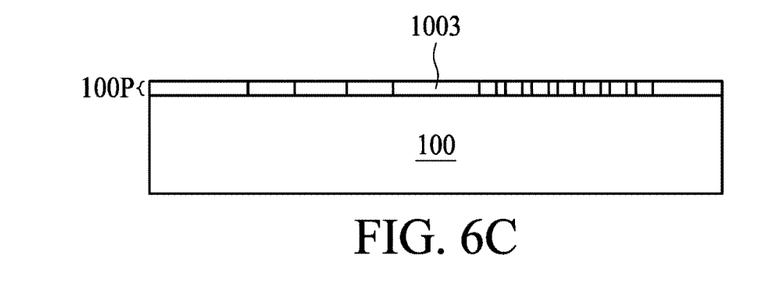
Figure 6D:
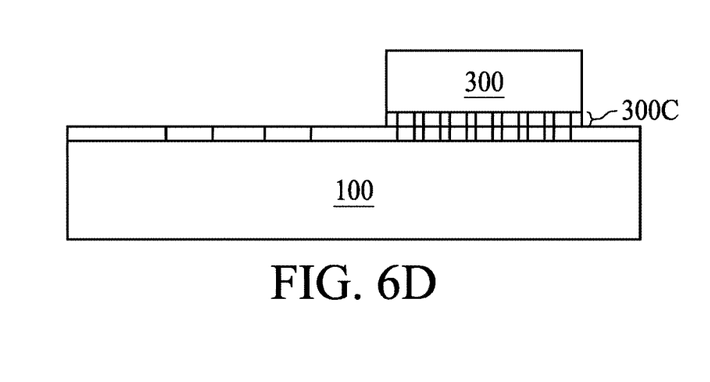
Figure 6E:
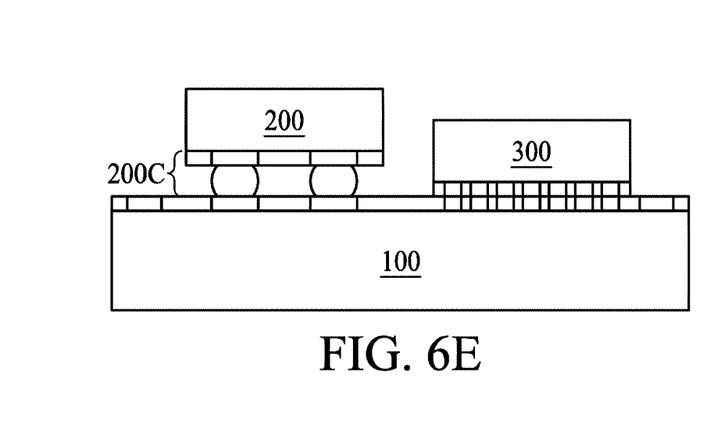
Figure 6F:
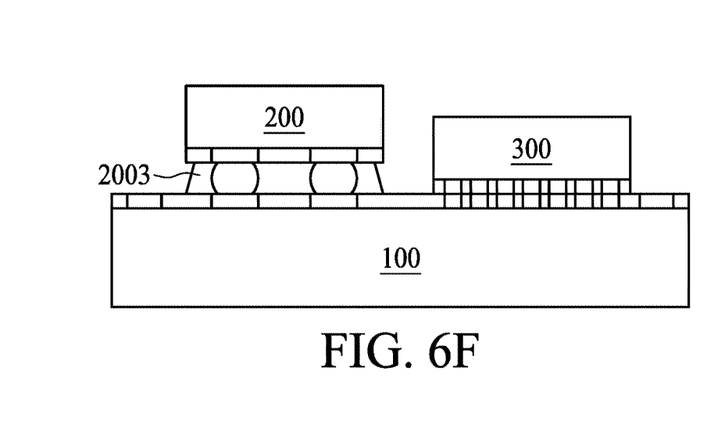
Figure 6G:
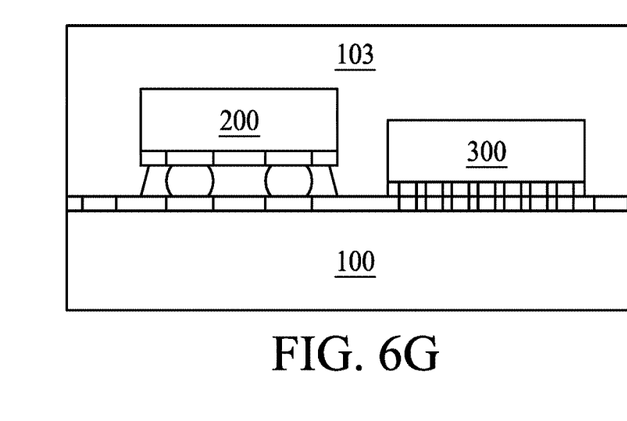
Figure 6H:
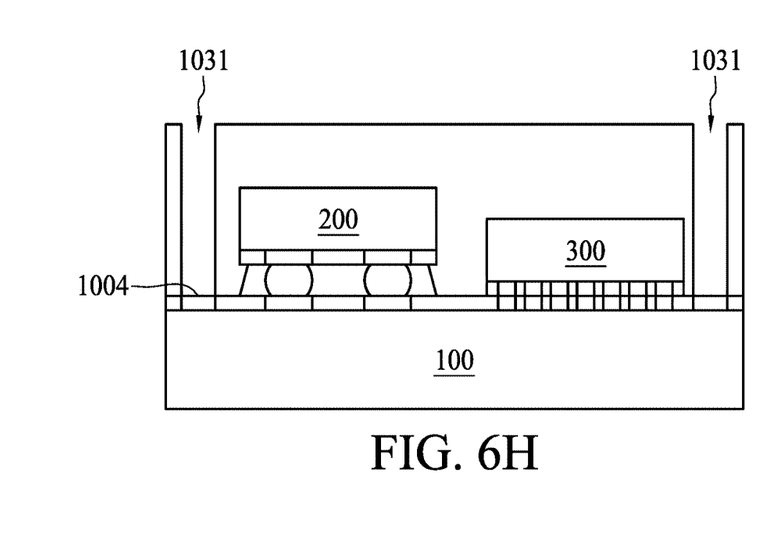
Figure 6I:
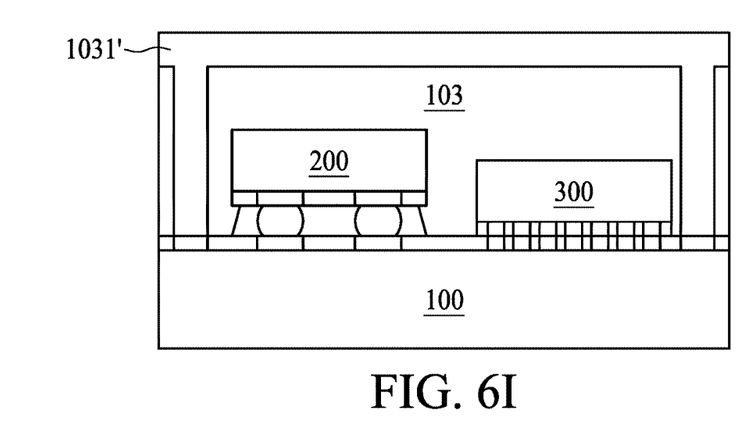
FIG. 6I, FIG. 6J illustrate cross sectional views of a semiconductor package structure during intermediate stages of manufacturing operations according to some embodiments of the present disclosure.
Figure 6J:
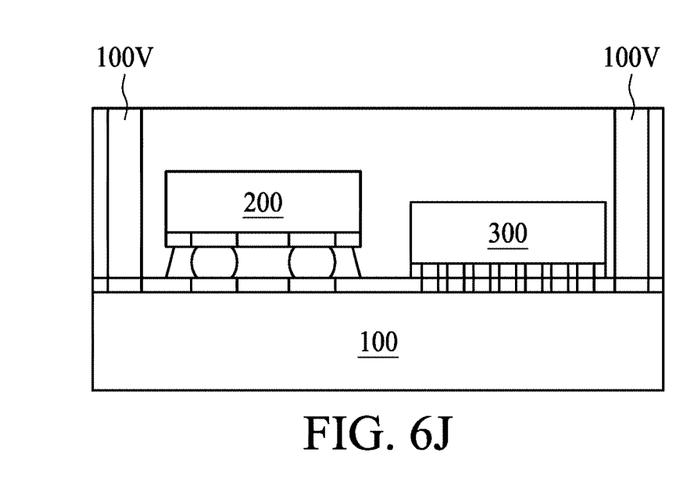

FIG. 6A, FIG. 6B, FIG. 6C, FIG. 6D, FIG. 6E, FIG. 6F, FIG. 6G, FIG. 6H, FIG. 6G', FIG. 6H', FIG. 6I, FIG. 6J illustrate cross sectional views of a semiconductor package structure during intermediate stages of manufacturing operations according to some embodiments of the present disclosure. In FIG. 6A, a substrate 100 is provided, and a conductive layer 100M, for example, a copper layer, is deposited over a surface to be patterned on the substrate 100. In FIG. 6B, a patterning operation is performed over the surface to be patterned to form a first region 100PB having a first conductive pattern 1001 and a second region 100PA having a second conductive pattern 1002. The first conductive pattern 1001 has a line width smaller than the second conductive pattern 1002. In FIG. 6C, a dielectric layer 1003 is formed over the surface to be patterned to planarize the conductive patterns 1001 and 1002. A planarization operation, such as a chemical mechanical polishing (CMP) operation, is performed after the formation of the dielectric layer 1003. The first conductive pattern 1001 has a first dishing response to the planarization operation, and the second conductive pattern 1002 has a second dishing response to the planarization operation. The first dishing response may be different from the second dishing response. The first dishing response may include a less recess response than the second dishing response. A patterned surface 100P including the first conductive pattern 1001 with the first dishing response and the second conductive pattern 1002 with second dishing response is completed in FIG. 6C.

In FIG. 6D, a die 300 is hybrid-bonded to the first conductive pattern 1001 having a first dishing response, for example, from 0 to 5 nm, and an erosion response, for example, a surface roughness of the dielectric 1003 surrounding first conductive pattern 1001, in the first region 100PB is less than 2 nm. The die 300 includes a conductive features 300C adapted for the first conductive pattern 1001. The conductive feature 300C may be implemented with a planarization operation, e.g., a CMP, prior to the die saw operation. Details of the conductive features 300C can be referred to FIG. 1A of the present disclosure. In FIG. 6E, a die 200 is bonded to the second conductive pattern 1002 having a second dishing response, for example, greater than 5 nm. The die 200 includes a conductive features 200C adapted for the second conductive pattern 1002. Details of the conductive features 200C can be referred to FIG. 1A of the present disclosure. In FIG. 6F, an underfill 2003 may be optionally formed between the die 200 and the patterned surface 100P in order to protect the solder bump in the conductive features 200C.

Figure 7A:
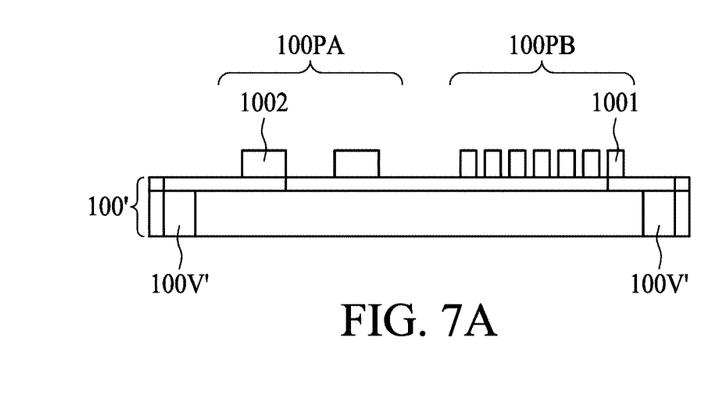
FIG. 7A, FIG. 7B, FIG. 7C, FIG. 7D, FIG. 7E, FIG. 7F, FIG. 7G illustrate cross sectional views of a semiconductor package structure during intermediate stages of manufacturing operations according to some embodiments of the present disclosure.
Figure 7B:
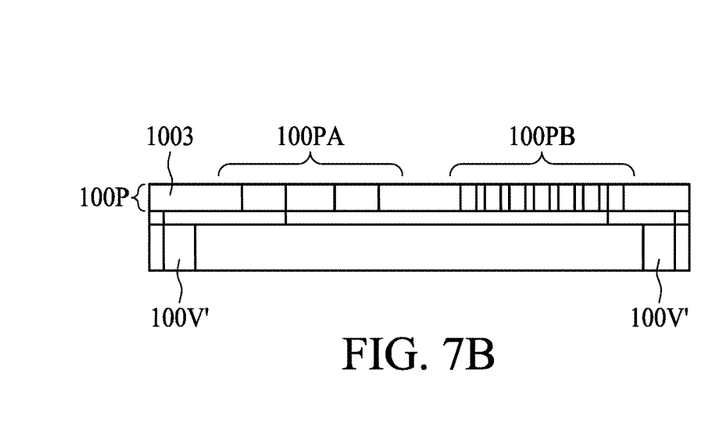

Following FIG. 6F, FIG. 6G, FIG. 6H, FIG. 6I, and FIG. 6J may adopted or FIG. 6G' and FIG. 6H' may be adopted. In FIG. 6G and FIG. 6H, an encapsulant 103 is formed over the patterned surface 100P to encapsulate the die 200 and the die 300. Opening 1031 may be formed in the encapsulant 103 until a conducive element 1004 on the patterned surface 100P is exposed. In FIG. 6I and FIG. 6J, conductive layer 1031' is deposited over the encapsulant 103 to fill the opening 1031 to an excessive extent, for example. The excessive conductive layer 1031' over the top surface of the encapsulant 103 is then removed through a planarization operation, thereby exposing a top of the through via 100V, as shown in FIG. 6J. On the other hand, if FIG. 6G' and FIG. 6H' is adopted, after the operation illustrated in FIG. 6F, through via 100V, which can be conductive pillars or copper pillars, is formed over the patterned surface 100P through a pick-and-place operation. In some embodiments, the disposal of the through via 100V may be assisted with stencil mask or electrostatic force. As shown in FIG. 6H', encapsulant 103 is formed to cover die 200, die 300, and through via 100V. A planarization operation is also implemented to remove excessive encapsulant 103 in order to exposing a top of the through via 100V FIG. 7A, FIG. 7B, FIG. 7C, FIG. 7D, FIG. 7E, FIG. 7F, FIG. 7G illustrate cross sectional views of a semiconductor package structure during intermediate stages of manufacturing operations according to some embodiments of the present disclosure. In FIG. 7A, a substrate 100' is provided, and a conductive layer (not shown), for example, a copper layer or an aluminum layer, is deposited over a surface to be patterned on the substrate 100'. The substrate 100' in FIG. 7A can be an interposer. For example, a silicon interposer with a through via 100V' fabricated therein. A patterning operation is performed over the surface to be patterned to form a first region 100PB having a first conductive pattern 1001 and a second region 100PA having a second conductive pattern 1002. The first conductive pattern 1001 has a line width smaller than the second conductive pattern 1002. In FIG. 7B, a dielectric layer 1003 is formed over the surface to be patterned to planarize the conductive patterns 1001 and 1002. A planarization operation, such as a chemical mechanical polishing (CMP) operation, is performed after the formation of the dielectric layer 1003. The first conductive pattern 1001 has a first dishing response to the planarization operation, and the second conductive pattern 1002 has a second dishing response to the planarization operation. The first dishing response may be different from the second dishing response. The first dishing response may include a less recess response than the second dishing response. A patterned surface 100P including the first conductive pattern 1001 with the first dishing response and the second conductive pattern 1002 with second dishing response is completed in FIG. 7B.

Figure 7C:
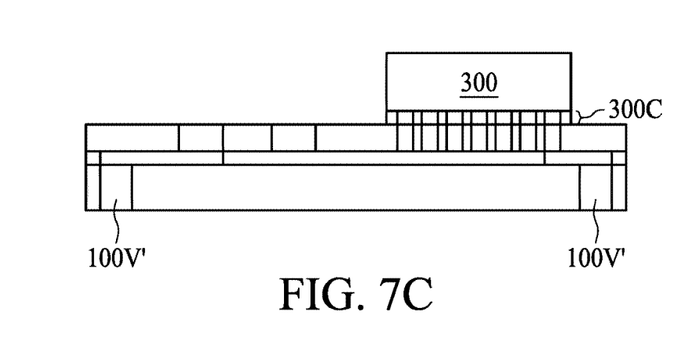
Figure 7D:
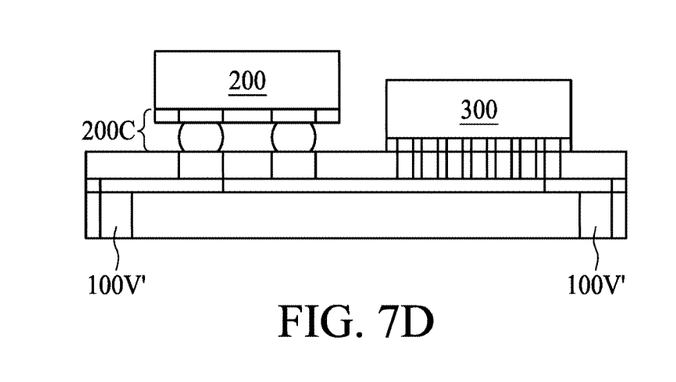
Figure 7E:
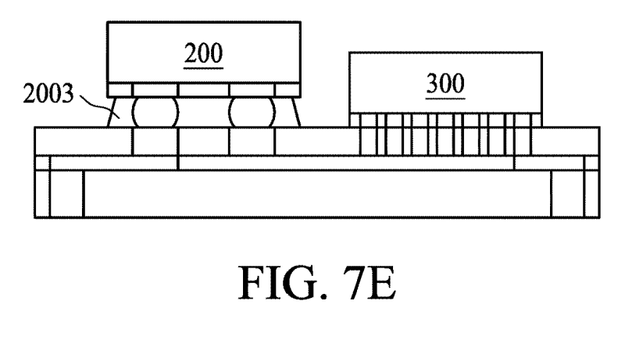
Figure 7F:
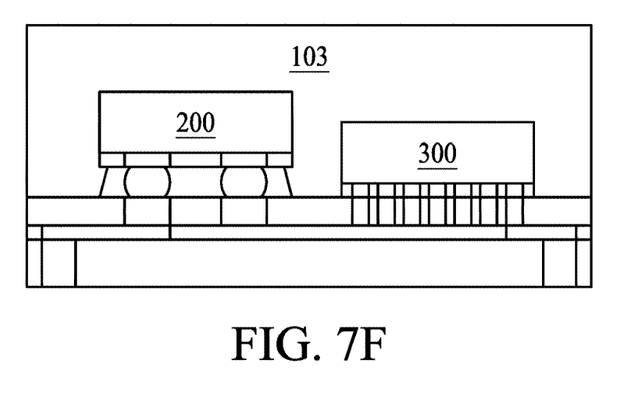
Figure 7G:
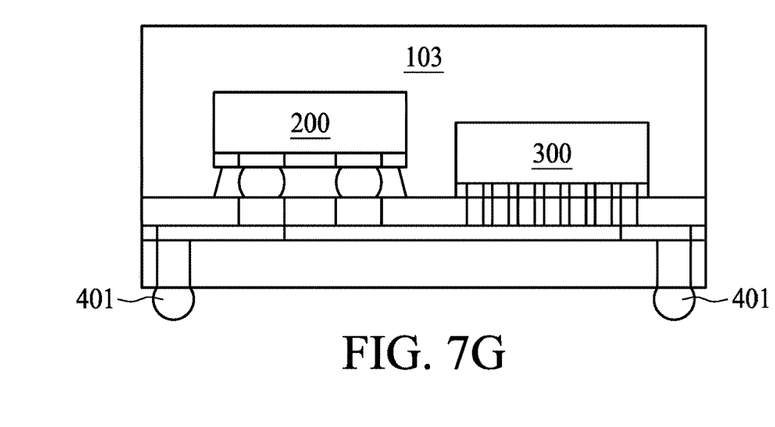

In FIG. 7C, a die 300 is hybrid-bonded to the first conductive pattern 1001 having a first dishing response, for example, from 0 to 5 nm, and an erosion response, for example, a surface roughness of the dielectric 1003 surrounding first conductive pattern 1001, in the first region 100PB is less than 2 nm. The die 300 includes a conductive features 300C adapted for the first conductive pattern 1001. The conductive feature 300C may be implemented with a planarization operation, e.g., a CMP, prior to the die saw operation. Details of the conductive features 300C can be referred to FIG. 1A of the present disclosure. In FIG. 7D, a die 200 is bonded to the second conductive pattern 1002 having a second dishing response, for example, greater than 5 nm. The die 200 includes a conductive features 200C adapted for the second conductive pattern 1002. Details of the conductive features 200C can be referred to FIG. 1A of the present disclosure. In FIG. 7E, an underfill 2003 may be optionally formed between the die 200 and the patterned surface 100P in order to protect the solder bump in the conductive features 200C. In FIG. 7F, an encapsulant 103 is formed to cover the die 200, the die 300, and the patterned surface 100P. In FIG. 7G, a conductive terminal 401 is disposed over the through via 100V' of the substrate 100', or the interposer, in order to electrically couple the semiconductor package structure of FIG. 7F to external carrier, for example, a PCB or another semiconductor die.

Referring back to FIG. 6A and FIG. 7A, in a system-in-package (SIP) structure, the substrate 100 can be a semiconductor die, and the conductive layer is formed over an active surface of the semiconductor die. In FIG. 6E and FIG. 7D, the bonding type of the die 200 may be different from flip-chip bonding as illustrated. Other bonding type, such as wire bonding, may be implemented as long as the second conductive pattern 1002 in the second region 100PA of patterned surface 100P is formed in accordance with the pattern or wire bonding for the die 200. The semiconductor package structure, or an SIP structure, including a hybrid bonded die and a wire bonded die can be referred to FIG. 2 and FIG. 4 of present disclosure.

Although one die 300 and die 200 are illustrated in the present disclosure to be bonded to the substrate 100 or substrate 100', extra dies can be formed over the patterned surface 100P through various bonding type as long as one of the bonding type is hybrid bonding. The patterned surface 100P is prepared according to all criteria for a hybrid-bonding operation, for example, including a CMP.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   a substrate having a patterned surface, the patterned surface comprising a first region and a second region, wherein a first line width in the first region is smaller than a second line width in the second region;
   a first die hybrid-bonded to the first region through conductive features adapted for the first line width; and
   a second die bonded to the second region through conductive features adapted for the second line width.

2. The semiconductor package structure of claim 1, wherein the second die is flip-chip bonded to the second region.

3. The semiconductor package structure of claim 1, wherein the second die is wire-bonded to the second region.

4. The semiconductor package structure of claim 1, wherein the first line width is smaller than 20 micrometer.

5. The semiconductor package structure of claim 1, wherein the second line width is greater than 20 micrometer.

6. The semiconductor package structure of claim 1, wherein the substrate comprises a third die.

7. The semiconductor package structure of claim 6, further comprising a through via on the patterned surface and disposed at a same level as the first die.

8. The semiconductor package structure of claim 1, wherein the substrate comprises an interposer.

9. The semiconductor package structure of claim 8, further comprising a through via in the interposer and below the patterned surface.

10. The semiconductor package structure of claim 1, wherein the conductive features of the second die comprises solder bumps or metal wires.

11. A system-in-package (SIP) structure, comprising:
a substrate having a patterned surface, the patterned surface comprising a first conductive pattern and a second conductive pattern;
a first die hybrid-bonded to the first conductive pattern of the patterned surface through conductive features adapted for the first conductive pattern; and
a second die bonded to the second conductive pattern of the patterned surface through conductive features adapted for the second conductive pattern.

12. The SIP structure of claim 11, wherein the patterned surface is a planarized surface.

13. The SIP structure of claim 11, wherein the first conductive pattern has a first line width smaller than a second line width of the second conductive pattern.

14. The SIP structure of claim 11, wherein the first conductive pattern has a line width smaller than 20 micrometers, and the second conductive pattern having a line width greater than 20 micrometers.

15. A method for manufacturing a semiconductor package structure, comprising:
providing a substrate having a patterned surface, the patterned surface comprising a first conductive pattern and a second conductive pattern,
performing a planarization operation on the patterned surface, the first conductive pattern having a first dishing response to a planarization operation, and the second conductive pattern having a second dishing response to the planarization operation, the first dishing response being different from the second dishing response;
hybrid-bonding a first die to the first region through conductive features adapted for the first conductive pattern; and
bonding a second die to the first region through conductive features adapted for the second conductive pattern.

16. The method of claim 15, wherein performing the planarization operation comprises:
performing a chemical mechanical polishing operation prior to hybrid-bonding the first die to the first region.

17. The method of claim 15, wherein the conductive feature of the first die comprises copper pillars.

18. The method of claim 17, wherein the conductive feature of the second die comprises solder bump or metal wires.

19. The method of claim 15, wherein providing the substrate having the patterned surface comprises:
providing a third die;
forming a conductive layer over a surface of the third die; and
forming the first conductive pattern and the second conductive pattern in the conductive layer.

20. The method of claim 15, wherein providing the substrate having the patterned surface comprises:
providing an interposer having the patterned surface and a through via in the interposer electrically connected to the patterned surface.

* * * * *